United States Patent
Khlat (10) Patent No.: US 11,563,421 B2
(45) Date of Patent: Jan. 24, 2023

(54) ACOUSTIC STRUCTURE HAVING TUNABLE PARALLEL RESONANCE FREQUENCY

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 935 days.

(21) Appl. No.: 16/385,301

(22) Filed: Apr. 16, 2019

(65) Prior Publication Data

US 2020/0099363 A1 Mar. 26, 2020

Related U.S. Application Data

(60) Provisional application No. 62/734,371, filed on Sep. 21, 2018.

(51) Int. Cl.
*H03H 9/54* (2006.01)
*H03H 9/13* (2006.01)
(Continued)

(52) U.S. Cl.
CPC ............. *H03H 9/545* (2013.01); *H03F 3/19* (2013.01); *H03H 9/02023* (2013.01);
(Continued)

(58) Field of Classification Search
CPC ...... H03H 9/545; H03H 9/02023; H03H 9/13; H03H 9/205; H03H 9/542; H03H 9/56;
(Continued)

(56) References Cited

U.S. PATENT DOCUMENTS 6,246,153 B1    6/2001  Bishop et al.
6,472,953 B1 *  10/2002  Sakuragawa ........ H03H 9/6483
                                                333/133
(Continued)

OTHER PUBLICATIONS

Non-Final Office Action for U.S. Appl. No. 16/356,279, dated Dec. 10, 2021, 9 pages.
(Continued)

*Primary Examiner* — Hafizur Rahman
(74) *Attorney, Agent, or Firm* — Withrow & Terranova, P.L.L.C.

(57) ABSTRACT

An acoustic structure is provided. The acoustic structure includes an acoustic resonator structure configured to resonate in a series resonance frequency (e.g., passband frequency) to pass a signal, or cause a series capacitance to block the signal in a parallel resonance frequency (e.g., stopband frequency). The parallel resonance frequency may become higher than the series resonance frequency when the tunable capacitance is lesser than or equal to two times of the series capacitance ($C_{Tune} \leq 2C_0$), or lower than the series resonance frequency when the tunable capacitance is greater than two times of the series capacitance ($C_{Tune} > 2C_0$). In this regard, the acoustic structure can be configured to include a tunable reactive circuit to generate the tunable capacitance ($C_{Tune}$) to adjust the parallel resonance frequency. As such, it may be possible to flexibly configure the acoustic resonator structure to block the signal in desired stopband frequencies.

16 Claims, 11 Drawing Sheets

(51) Int. Cl.
  *H03F 3/19* (2006.01)
  *H03H 9/205* (2006.01)
  *H03H 9/02* (2006.01)
  *H03H 9/56* (2006.01)

(52) U.S. Cl.
  CPC .............. *H03H 9/13* (2013.01); *H03H 9/205* (2013.01); *H03H 9/542* (2013.01); *H03H 9/56* (2013.01); *H03F 2200/294* (2013.01); *H03F 2200/451* (2013.01); *H03H 2210/012* (2013.01); *H03H 2210/025* (2013.01)

(58) Field of Classification Search
  CPC ........ H03H 2210/012; H03H 2210/025; H03F 3/19; H03F 2200/294; H03F 2200/451
  See application file for complete search history.

(56) References Cited

U.S. PATENT DOCUMENTS

| | | | |
|---|---|---|---|
| 6,671,016 | B1 | 12/2003 | Kim |
| 7,333,831 | B2 | 2/2008 | Srinivasan et al. |
| 7,459,990 | B2 | 12/2008 | Wunnicke et al. |
| 7,515,018 | B2 | 4/2009 | Handtmann et al. |
| 8,026,776 | B2 | 9/2011 | Ueda et al. |
| 9,698,752 | B2 * | 7/2017 | Burgener ................. H01Q 1/50 |
| 9,985,605 | B2 | 5/2018 | Tani et al. |
| 10,284,174 | B2 | 5/2019 | Khlat et al. |
| 2007/0024392 | A1 * | 2/2007 | Inoue .................... H03H 9/725 333/133 |
| 2008/0055020 | A1 | 3/2008 | Handtmann et al. |
| 2009/0273415 | A1 | 11/2009 | Frank et al. |
| 2016/0191016 | A1 | 6/2016 | Khlat et al. |
| 2017/0093370 | A1 | 3/2017 | Khlat et al. |
| 2017/0201233 | A1 | 7/2017 | Khalt |
| 2018/0019731 | A1 | 1/2018 | Tsukamoto et al. |
| 2019/0181834 | A1 * | 6/2019 | Bauder .................... H03J 3/20 |
| 2020/0099360 | A1 | 3/2020 | Khlat |
| 2020/0099362 | A1 | 3/2020 | Khlat |
| 2020/0099364 | A1 | 3/2020 | Khlat |

OTHER PUBLICATIONS

Notice of Allowance for U.S. Appl. No. 16/387,940, dated Jan. 21, 2020, 7 pages.
U.S. Appl. No. 16/356,279, filed Mar. 18, 2019.
U.S. Appl. No. 16/358,913, filed Mar. 20, 2019.
Non-Final Office Action for U.S. Appl. No. 16/358,913, dated May 7, 2020, 9 pages.
Non-Final Office Action for U.S. Appl. No. 16/358,913, dated Jun. 9, 2020, 6 pages.
Final Office Action for U.S. Appl. No. 16/358,913, dated Sep. 28, 2020, 11 pages.
Notice of Allowance for U.S. Appl. No. 16/358,913, dated Dec. 3, 2020, 7 pages.
Notice of Allowance for U.S. Appl. No. 16/358,913, dated Nov. 16, 2020, 7 pages.
Karasawa, Rei, et al., "c-Axis zig-zag polarization inverted ScAIN multilayer for FBAR transformer rectifying antenna," IEEE International Ultrasonics Symposium, 2017, Washington, DC, 4 pages.
Larson, John, et al., "Characterization of Reversed c-axis AIN Thin Films," IEEE International Ultrasonics Symposium, San Diego, California, 2010, pp. 1054-1059.
Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2019, Bohemia, New York, 43 pages.
Non-Final Office Action for U.S. Appl. No. 16/387,940, dated Sep. 26, 2019, 10 pages.
Notice of Allowance for U.S. Appl. No. 16/356,279, dated Apr. 27, 2022, 7 pages.

* cited by examiner

ACOUSTIC STRUCTURE HAVING TUNABLE PARALLEL RESONANCE FREQUENCY

RELATED APPLICATIONS

This application claims the benefit of U.S. provisional patent application Ser. No. 62/734,371, filed on Sep. 21, 2018, the disclosure of which is incorporated herein by reference in its entirety.

FIELD OF THE DISCLOSURE

The technology of the disclosure relates generally to an acoustic resonator(s)/filter(s).

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as surface acoustic wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filter of choices for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include an acoustic structure having tunable parallel resonance frequency. The acoustic structure includes an acoustic resonator structure configured to resonate in a series resonance frequency (e.g., passband frequency) to pass a signal, or cause a series capacitance to block the signal in a parallel resonance frequency (e.g., stopband frequency). While the series resonance frequency is primarily determined by internal factors of the acoustic resonator structure, the parallel resonance frequency may be influenced by such external factors as a tunable capacitance ($C_{Tune}$). Specifically, the parallel resonance frequency may become higher than the series resonance frequency when the tunable capacitance is lesser than or equal to two times of the series capacitance ($C_{Tune} \leq 2C_0$), or lower than the series resonance frequency when the tunable capacitance is greater than two times of the series capacitance ($C_{Tune} > 2C_0$). In this regard, the acoustic structure can be configured to include a tunable reactive circuit to generate the tunable capacitance ($C_{Tune}$) to adjust the parallel resonance frequency. As such, it may be possible to flexibly configure the acoustic resonator structure to block the signal in desired stopband frequencies.

In one aspect, an acoustic structure is provided. The acoustic structure includes an input node and an output node. The acoustic structure also includes an acoustic resonator structure coupled between the input node and the output node. The acoustic resonator structure is configured to resonate in a series resonance frequency to pass a signal from the input node to the output node. The acoustic resonator structure is also configured to cause at least one series capacitance between the input node and the output node to block the signal in at least one parallel resonance frequency. The acoustic structure also includes a tunable reactive circuit coupled to the acoustic resonator structure. The tunable reactive circuit is configured to generate at least one tunable capacitance related to the at least one series capacitance to cause the at least one parallel resonance frequency to be changed relative to the series resonance frequency.

In another aspect, an acoustic apparatus is provided. The acoustic apparatus includes an input node and an output node. The acoustic apparatus also includes an acoustic resonator structure coupled between the input node and the output node. The acoustic resonator structure is configured to resonate in a series resonance frequency to pass a signal from the input node to the output node. The acoustic resonator structure is also configured to cause a series capacitance between the input node and the output node to block the signal in a parallel resonance frequency. The acoustic apparatus also includes a tunable reactive circuit coupled to the acoustic resonator structure. The tunable reactive circuit is configured to generate a tunable capacitance proportionally related to the series capacitance to cause the parallel resonance frequency to be changed relative to the series resonance frequency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic structure having tunable parallel resonance frequency. The acoustic structure includes an acoustic resonator structure configured to resonate in a series resonance frequency (e.g., passband frequency) to pass a signal, or cause a series capacitance to block the signal in a parallel resonance frequency (e.g., stopband frequency). While the series resonance frequency is primarily determined by internal factors of the acoustic resonator structure, the parallel resonance frequency may be influenced by such external factors as a tunable capacitance ($C_{Tune}$). Specifically, the parallel resonance frequency may become higher than the series resonance frequency when the tunable capacitance is lesser than or equal to two times the series capacitance ($C_{Tune} \leq 2C_0$), or lower than the series resonance frequency when the tunable capacitance is greater than two times the series capacitance ($C_{Tune} > 2C_0$). In this regard, the acoustic structure can be configured to include a tunable reactive circuit to generate the tunable capacitance ($C_{Tune}$) to adjust the parallel resonance frequency. As such, it may be possible to flexibly configure the acoustic resonator structure to block the signal in desired stopband frequencies.

Figure 1A:
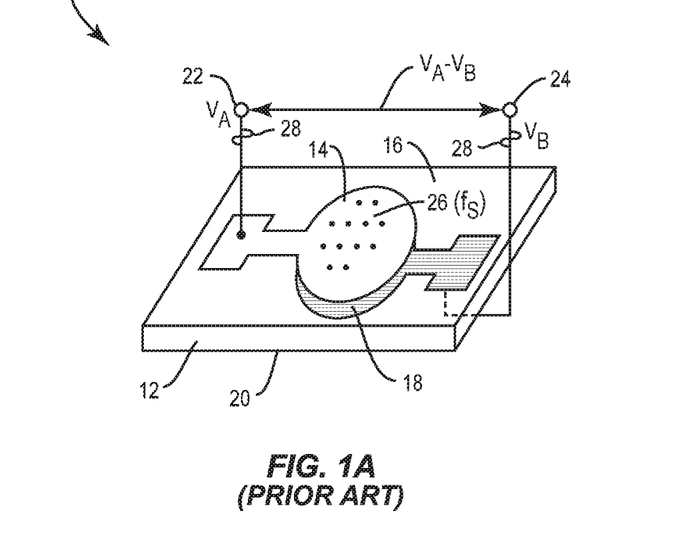
FIG. 1A is a schematic diagram of an exemplary bulk acoustic wave (BAW) resonator.
Figure 1B:
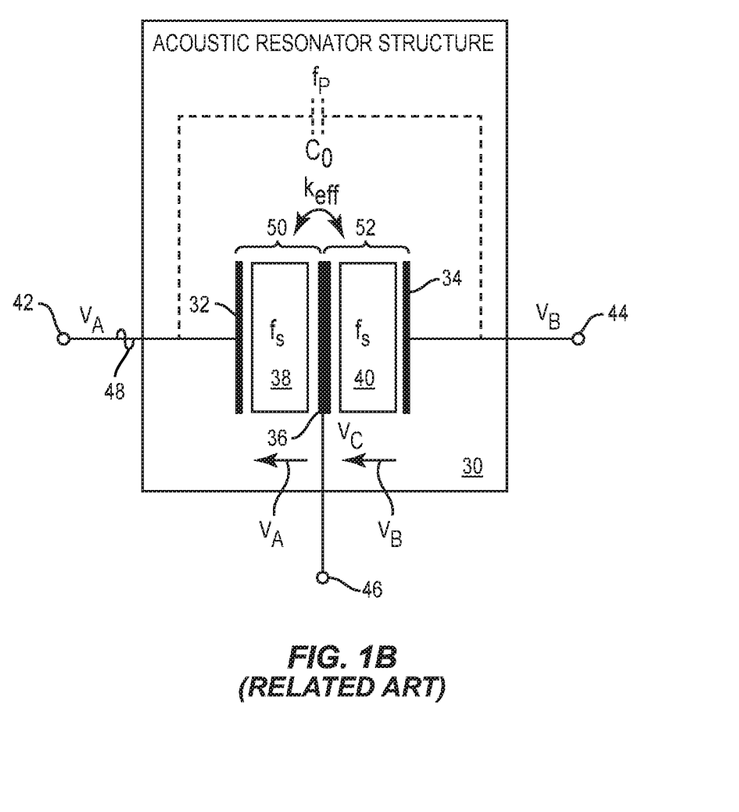
FIG. 1B is a schematic diagram of an exemplary acoustic resonator structure that may be constructed based on the BAW resonator of FIG. 1A.

Before discussing an acoustic structure having tunable parallel resonance frequency of the present disclosure, a brief discussion of a bulk acoustic wave (BAW) acoustic resonator and an acoustic resonator structure incorporating a pair of BAW acoustic resonators is first provided with reference to FIGS. 1A and 1B, respectively, to help understand some key characteristics of the acoustic resonator structure. The discussion of specific exemplary aspects of the acoustic structure having tunable parallel resonance frequency of the present disclosure starts below with reference to FIG. 2A.

In this regard, FIG. 1A is a schematic diagram of an exemplary BAW resonator 10. The BAW resonator 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a first voltage $V_A$ and a second voltage $V_B$ are applied to a top electrical port 22 and a bottom electrical port 24, respectively, the BAW resonator 10 resonates in a series resonance frequency ($f_S$) to cause an acoustic wave 26 between the top surface 16 and the bottom surface 20 of the piezo layer 12. The series resonance frequency ($f_S$) may be determined by a thickness of the piezo layer 12 as well as a mass of the top metal electrode 14 and the bottom metal electrode 18. As a result, the BAW resonator 10 can pass a signal 28 from the top electrical port 22 to the bottom electrical port 24, thus making the BAW resonator 10 able to function as a signal filter in the series resonance frequency.

FIG. 1B is a schematic diagram of an exemplary acoustic resonator structure 30 that may be constructed based on the BAW resonator 10 of FIG. 1A. The acoustic resonator structure 30 includes a first electrode 32, a second electrode 34, and a third electrode 36. The third electrode 36 is provided in between the first electrode 32 and the second electrode 34. The acoustic resonator structure 30 includes a first piezo layer 38 provided between the first electrode 32 and the third electrode 36. The acoustic resonator structure 30 also includes a second piezo layer 40 provided between the third electrode 36 and the second electrode 34. In a non-limiting example, the first piezo layer 38 and the second piezo layer 40 can be formed by quartz crystal. The thickness of the first piezo layer 38 and the second piezo layer 40 and/or the mass of the first electrode 32, the second electrode 34, and the third electrode 36 are factors that determine a series resonance frequency ($f_S$) of the acoustic resonator structure 30.

The first electrode 32, the second electrode 34, and the third electrode 36 may be coupled to an input node 42, an output node 44, and a common node 46, respectively. When a first voltage $V_A$ is applied between the input node 42 and the common node 46 concurrent to a second voltage $V_B$ being applied between the output node 44 and the common node 46, the acoustic resonator structure 30 resonates in the series resonance frequency ($f_S$) to pass a signal 48 from the input node 42 to the output node 44. In this regard, the acoustic resonator structure 30 functions as a bandpass filter in the series resonance frequency ($f_S$). As such, the series resonance frequency ($f_S$) can also be referred to as a passband frequency.

In contrast, the acoustic resonator structure 30 can cause a series capacitance ($C_O$) between the input node 42 and the output node 44 to block the signal 48 in a parallel resonance frequency ($f_P$) that is different from the series resonance frequency ($f_S$). In this regard, the acoustic resonator structure 30 functions as a stopband filter in the parallel resonance frequency ($f_P$). Accordingly, the parallel resonance frequency ($f_P$) can also be referred to as a stopband frequency.

The first electrode 32, the first piezo layer 38, and the third electrode 36 may be seen as collectively forming a first BAW resonator 50. Likewise, the third electrode 36, the second piezo layer 40, and the second electrode 34 may be seen as collectively forming a second BAW resonator 52. In this regard, the acoustic resonator structure 30 may be seen as being formed by stacking the first BAW resonator 50 with the second BAW resonator 52. In this regard, the first BAW resonator 50 and the second BAW resonator 52 can be seen as being mutually coupled based on an effective coupling factor ($k_{eff}$), which can be determined based on equation (Eq. 1) below.

$$k_{eff}^2 = \frac{\pi f_S}{2 f_P} * \left[ \tan^{-1} \frac{\pi f_S}{2 f_P} \right] \qquad \text{(Eq. 1)}$$

Both the first BAW resonator 50 and the second BAW resonator 52 are configured to resonate in the series resonance frequency ($f_S$) to pass the signal 48 from the input node 42 to the output node 44. In one non-limiting example, the first electrode 32, the first piezo layer 38, and the third electrode 36 can form a polarized BAW resonator (also referred to as a c-type structure). In this regard, the first piezo layer 38 expands in response to the first voltage $V_A$ being a positive voltage and compresses in response to the first voltage $V_A$ being a negative voltage. The third electrode 36, the second piezo layer 40, and the second electrode 34 can form a polarized-inverted BAW resonator (also referred to as an f-type structure). In this regard, the second piezo layer 40 expands in response to the second voltage $V_B$ being a negative voltage and compresses in response to the second voltage $V_B$ being a positive voltage. Accordingly, the acoustic resonator structure 30 outputs a third voltage $V_C$ (also referred to as a shunt voltage $V_C$) via the common node 46. The third voltage $V_C$ is related to the first voltage $V_A$ and the second voltage $V_B$ in accordance to equation (Eq. 2) below.

$$(V_A - V_C) = (V_C - V_B) \rightarrow V_C = (V_A + V_B)/2 \qquad \text{(Eq. 2)}$$

As mentioned earlier, the series resonance frequency ($f_S$) is primarily determine by such internal factors as thickness of the first piezo layer 38 and the second piezo layer 40 and/or the mass of the first electrode 32, the second electrode 34, and the third electrode 36 are factors. As such, it may be difficult to change the series resonance frequency ($f_S$) once the acoustic resonator structure 30 has been formed. However, as discussed in the exemplary embodiments below, it may be possible to change the parallel resonance frequency ($f_P$) of the acoustic resonator structure 30 via such external factors as a tunable capacitance ($C_{Tune}$) coupled to the acoustic resonator structure 30.

Figure 2A:
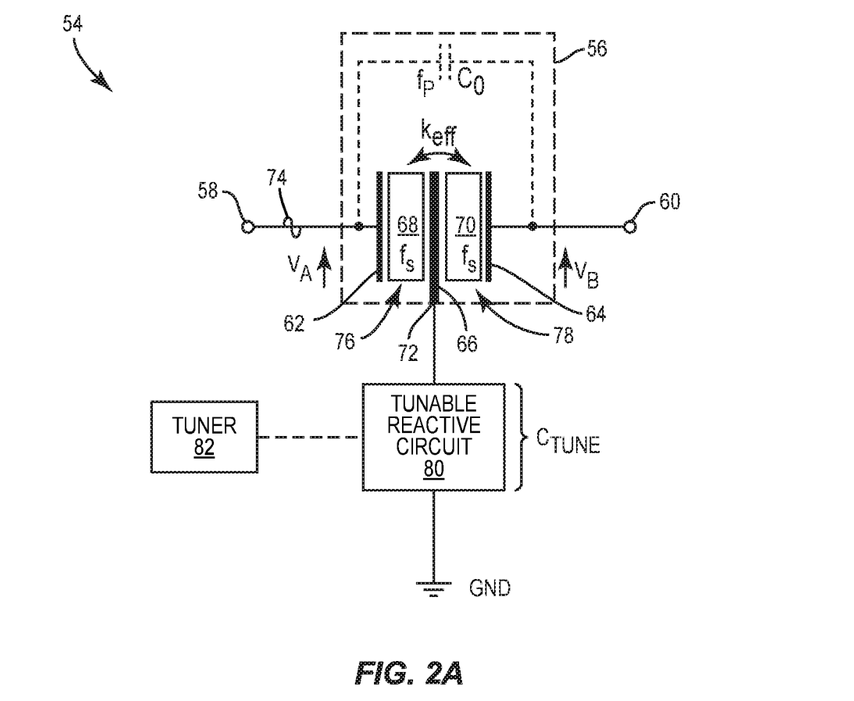
FIG. 2A is a schematic diagram of an exemplary acoustic structure configured according to an embodiment of the present disclosure to support tunable parallel resonance frequency.

FIG. 2A is a schematic diagram of an exemplary acoustic structure 54 configured according to an embodiment of the present disclosure to support tunable parallel resonance frequency. The acoustic structure 54 includes an acoustic resonator structure 56 coupled between an input node 58 and an output node 60. In a non-limiting example, the acoustic resonator structure 56 is functionally equivalent to the acoustic resonator structure 30 in FIG. 1B.

In this regard, the acoustic resonator structure 56 includes a first electrode 62, a second electrode 64, and a third electrode 66. The third electrode 66 is provided in between the first electrode 62 and the second electrode 64. The acoustic resonator structure 56 includes a first piezo layer 68 provided between the first electrode 62 and the third electrode 66. The acoustic resonator structure 56 also includes a second piezo layer 70 provided between the third electrode 66 and the second electrode 64. In a non-limiting example, the first piezo layer 68 and the second piezo layer 70 can be formed by quartz crystal. The thickness of the first piezo layer 68 and the second piezo layer 70 as well as the mass of the first electrode 32, the second electrode 34, and the third electrode 36 are internal factors that determine a series resonance frequency ($f_S$) of the acoustic resonator structure 56.

The first electrode 62, the second electrode 64, and the third electrode 66 may be coupled to the input node 58, the output node 60, and a common node 72, respectively. When a first voltage $V_A$ is applied between the input node 58 and the common node 72 concurrent to a second voltage $V_B$ being applied between the output node 60 and the common node 72, the acoustic resonator structure 56 resonates in the series resonance frequency ($f_S$) to pass a signal 74 from the input node 58 to the output node 60. In this regard, the acoustic resonator structure 56 functions as a bandpass filter in the series resonance frequency ($f_S$), which can be referred to as a passband frequency.

In contrast, the acoustic resonator structure 56 can cause at least one series capacitance ($C_0$) between the input node 58 and the output node 60 to block the signal 74 in at least one parallel resonance frequency ($f_P$) that is different from the series resonance frequency ($f_S$). In this regard, the acoustic resonator structure 56 functions as a stopband filter in the parallel resonance frequency ($f_P$), which can also be referred to as a stopband frequency.

The first electrode 62, the first piezo layer 68, and the third electrode 66 may be seen as collectively forming a first BAW resonator 76 (also referred to as "first acoustic resonator"). Likewise, the third electrode 66, the second piezo layer 70, and the second electrode 64 may be seen as collectively forming a second BAW resonator 78 (also referred to as "second acoustic resonator"). In this regard, the acoustic resonator structure 56 may be seen as being formed by stacking the first BAW resonator 76 with the second BAW resonator 78. In this regard, the first BAW resonator 76 and the second BAW resonator 78 can be seen as being mutually coupled based on an effective coupling factor ($k_{eff}$), which can be determined based on the equation (Eq. 1) above.

Although the series resonance frequency ($f_S$) is primarily determined by such internal factors as the thickness of the first piezo layer 68 and the second piezo layer 70 as well as the mass of the first electrode 32, the second electrode 34, and the third electrode 36, studies had proven that it may be possible to change the parallel resonance frequency ($f_P$) by coupling a tunable capacitance ($C_{Tune}$) to the common node 72 and set the tunable capacitance ($C_{Tune}$) relative to the series capacitance ($C_0$). As such, it may be possible to adapt the parallel resonance frequency ($f_P$) to block the signal 74 in a desired stopband frequency, thus making it possible to flexibly configure the acoustic resonator structure 56 to meet a specific application requirement(s).

In this regard, the acoustic structure 54 further includes a tunable reactive circuit 80 coupled between the common node 72 and a ground (GND). The tunable reactive circuit 80 can be configured (e.g., via a tuner 82) to generate the tunable capacitance ($C_{Tune}$) that is proportionally related to the series capacitance ($C_0$) to cause the parallel resonance frequency ($f_P$) to be changed relative to the series resonance frequency ($f_S$).

Figure 2B:
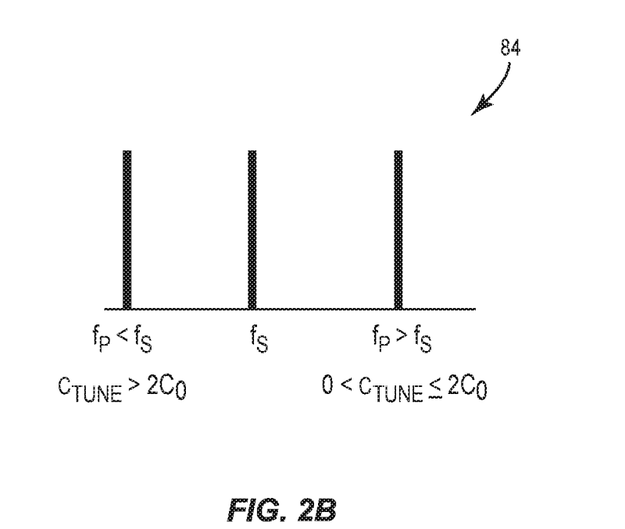
FIG. 2B is schematic diagram summarizing an interrelation between a parallel resonance frequency, a series resonance frequency, a series capacitance, and a tunable capacitance that are related to the acoustic structure of FIG. 2A.

FIG. 2B is schematic diagram 84 summarizing an interrelation between the parallel resonance frequency ($f_P$), the series resonance frequency ($f_S$), the series capacitance ($C_0$), and the tunable capacitance ($C_{Tune}$). As shown in the schematic diagram 84, when the tunable capacitance ($C_{Tune}$) is greater than zero (0) and lesser than or equal to two times of the series capacitance ($C_0$) ($0<C_{Tune}\leq 2C_0$), the parallel resonance frequency ($f_P$) becomes higher than the series resonance frequency ($f_S$). Thus, according to the equation (Eq. 1) above, the effective coupling factor ($k_{eff}$) would be positive.

In contrast, when the tunable capacitance ($C_{Tune}$) is greater than two times the series capacitance ($C_0$) ($C_{Tune}>2C_0$), the parallel resonance frequency ($f_P$) becomes lower than the series resonance frequency ($f_S$). Thus, according to the equation (Eq. 1) above, the effective coupling factor ($k_{eff}$) would be negative. When the tunable capacitance ($C_{Tune}$) equals 0 ($C_{Tune}=0$), the parallel resonance frequency ($f_P$) will solely depend on the effective coupling factor ($k_{eff}$).

Figure 3A:
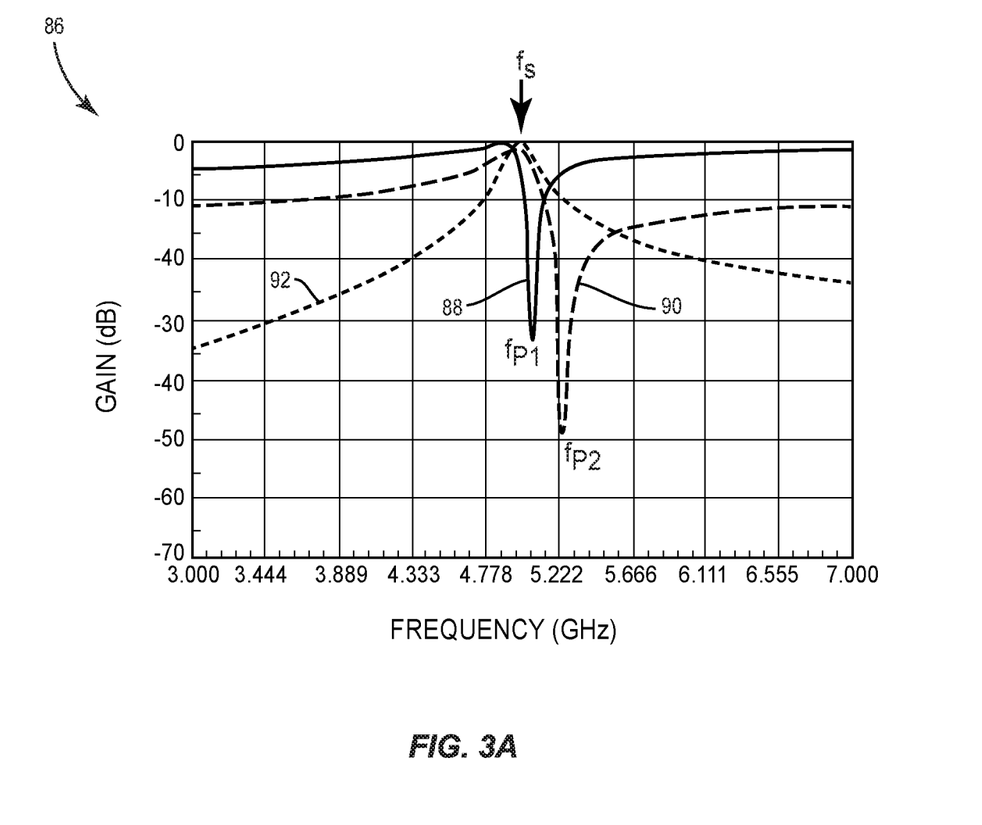
FIG. 3A is a graphic diagram providing an exemplary illustration of the interrelation between the parallel resonance frequency, the series resonance frequency, the series capacitance, and the tunable capacitance in FIG. 2B.

The above-described interrelation between the parallel resonance frequency ($f_P$), the series resonance frequency ($f_S$), the series capacitance ($C_0$), and the tunable capacitance ($C_{Tune}$) can be further proved by a number of simulation results, as discussed next in FIGS. 3A-3C. In this regard, FIG. 3A is a graphic diagram 86 providing an exemplary illustration of the interrelation between the parallel resonance frequency ($f_P$), the series resonance frequency ($f_S$), the series capacitance ($C_0$), and the tunable capacitance ($C_{Tune}$) in FIG. 2B. Elements in FIG. 2B are referenced in conjunction with FIG. 3A and will not be re-described herein.

The graphic diagram 86 includes a first curve 88, a second curve 90, and a third curve 92. The first curve 88 corresponds to a condition wherein the tunable capacitance ($C_{Tune}$) equals 0 ($C_{Tune}=0$). The second curve 90 corresponds to a condition wherein the tunable capacitance ($C_{Tune}$) equals the series capacitance $C_0$ ($C_{Tune}=C_0$). The third curve 92 corresponds to a condition wherein the tunable capacitance ($C_{Tune}$) equals two times the series capacitance $C_0$ ($C_{Tune}=2C_0$).

In the graphic diagram 86, the series resonance ($f_S$) is shown to correspond to a gain of 0 dB. When the tunable capacitance ($C_{Tune}$) equals 0, a first parallel resonance frequency ($f_{P1}$) is determined by the effective coupling factor ($k_{eff}$), which is higher than the series resonance frequency ($f_S$), as illustrated in the first curve 88. However, when tunable capacitance ($C_{Tune}$) equals the series capacitance ($C_0$), the second curve 90 shows that a second parallel resonance frequency ($f_{P2}$) becomes higher than the series resonance frequency ($f_S$) as well as the first parallel resonance frequency ($f_{P1}$). As such, the graphic diagram 86 proves that it is possible to change the parallel resonance frequency ($f_P$) by changing an interrelation between the tunable capacitance ($C_{Tune}$) and the series capacitance ($C_0$).

Figure 3B:
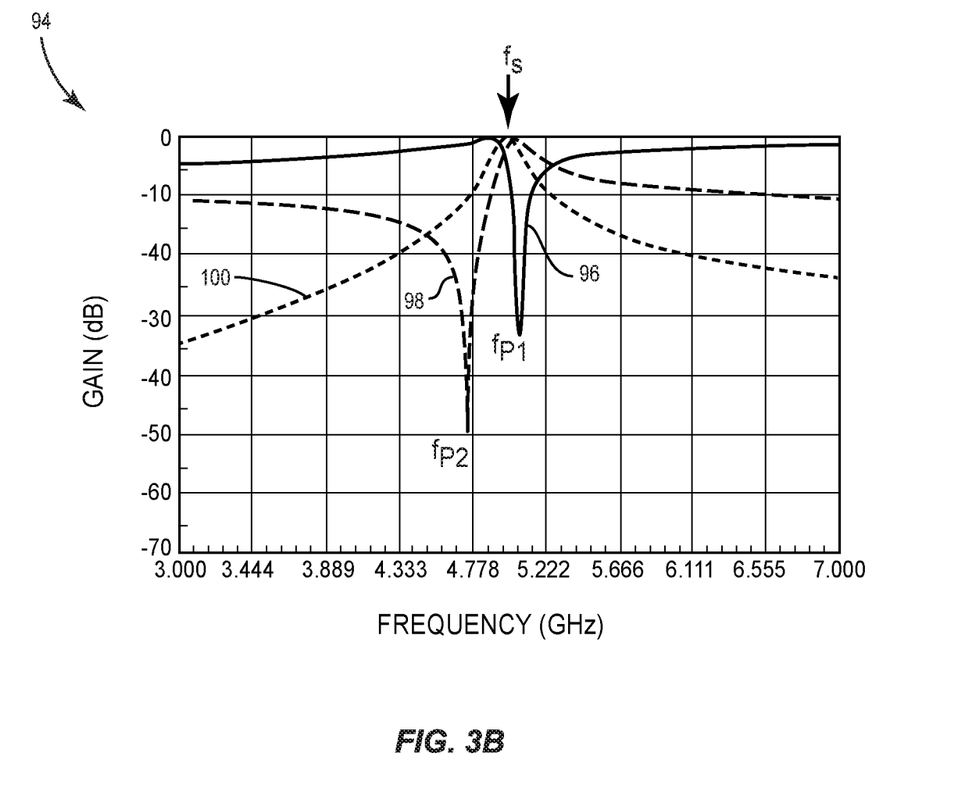
FIG. 3B is a graphic diagram providing another exemplary illustration of the interrelation between the parallel resonance frequency, the series resonance frequency, the series capacitance, and the tunable capacitance in FIG. 2B.

FIG. 3B is a graphic diagram 94 providing another exemplary illustration of the interrelation between the parallel resonance frequency ($f_P$), the series resonance frequency ($f_S$), the series capacitance ($C_0$), and the tunable capacitance ($C_{Tune}$) in FIG. 2B. Elements in FIG. 2B are referenced in conjunction with FIG. 3B and will not be re-described herein.

The graphic diagram 94 includes a first curve 96, a second curve 98, and a third curve 100. The first curve 96 corresponds to a condition wherein the tunable capacitance ($C_{Tune}$) equals 0 ($C_{Tune}=0$). The second curve 98 corresponds to a condition wherein the tunable capacitance ($C_{Tune}$) is greater than two times the series capacitance $C_0$ ($C_{Tune}>2C_0$). The third curve 100 corresponds to a condition wherein the tunable capacitance ($C_{Tune}$) equals two times the series capacitance $C_0$ ($C_{Tune}=2C_0$).

In the graphic diagram 94, the series resonance ($f_S$) is shown to correspond to a gain of 0 dB. When the tunable capacitance ($C_{Tune}$) equals 0, a first parallel resonance frequency ($f_{P1}$) is determined by the effective coupling factor ($k_{eff}$), which is higher than the series resonance frequency ($f_S$), as illustrated in the first curve 96. However, when the tunable capacitance ($C_{Tune}$) is greater than two times the series capacitance ($C_0$), the second curve 98 shows that a second parallel resonance frequency ($f_{P2}$) becomes lower than the series resonance frequency ($f_S$) as well as the first parallel resonance frequency ($f_{P1}$). As such, the graphic diagram 94 further proves that it is possible to change the parallel resonance frequency ($f_P$) by changing an interrelation between the tunable capacitance ($C_{Tune}$) and the series capacitance ($C_0$).

Figure 3C:
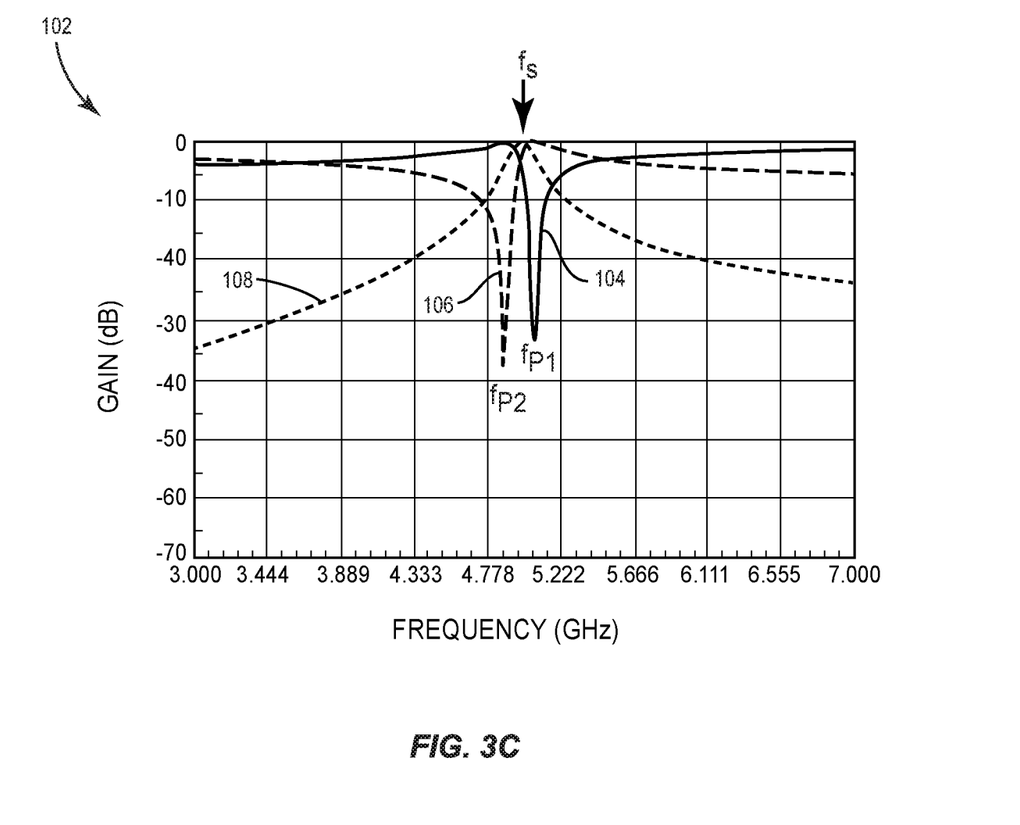
FIG. 3C is a graphic diagram providing another exemplary illustration of the interrelation between the parallel resonance frequency, the series resonance frequency, the series capacitance, and the tunable capacitance in FIG. 2B.

FIG. 3C is a graphic diagram 102 providing another exemplary illustration of the interrelation between the parallel resonance frequency ($f_P$), the series resonance frequency ($f_S$), the series capacitance ($C_0$), and the tunable capacitance ($C_{Tune}$) in FIG. 2B. Elements in FIG. 2B are referenced in conjunction with FIG. 3C and will not be re-described herein.

The graphic diagram 102 includes a first curve 104, a second curve 106, and a third curve 108. The first curve 104 corresponds to a condition wherein the tunable capacitance ($C_{Tune}$) equals 0 ($C_{Tune}$=0). The second curve 106 corresponds to a condition wherein the tunable capacitance ($C_{Tune}$) is substantially greater than two times the series capacitance $C_0$ (e.g., $C_{Tune}$=25$C_0$). The third curve 108 corresponds to a condition wherein the tunable capacitance ($C_{Tune}$) equals two times the series capacitance $C_0$ ($C_{Tune}$=2$C_0$).

In the graphic diagram 102, the series resonance ($f_S$) is shown to correspond to a gain of 0 dB. When the tunable capacitance ($C_{Tune}$) equals 0, a first parallel resonance frequency ($f_{P1}$) is determined by the effective coupling factor ($k_{eff}$), which is higher than the series resonance frequency ($f_S$), as illustrated in the first curve 104. However, when tunable capacitance ($C_{Tune}$) is substantially greater than two times the series capacitance ($C_0$), the second curve 106 shows that a second parallel resonance frequency ($f_{P2}$) becomes lower than the series resonance frequency ($f_S$) as well as the first parallel resonance frequency ($f_{P1}$). As such, the graphic diagram 102 further proves that it is possible to change the parallel resonance frequency ($f_P$) by changing an interrelation between the tunable capacitance ($C_{Tune}$) and the series capacitance ($C_0$).

With reference back to FIG. 2A, in one non-limiting example, the first electrode 62, the first piezo layer 68, and the third electrode 66 can form a polarized BAW resonator 76 (also referred to as a c-type structure). In this regard, the first piezo layer 68 expands in response to the first voltage $V_A$ being a positive voltage and compresses in response to the first voltage $V_A$ being a negative voltage. The third electrode 66, the second piezo layer 70, and the second electrode 64 can form a polarized-inverted BAW resonator 78 (also referred to as an f-type structure). In this regard, the second piezo layer 70 expands in response to the second voltage $V_B$ being a negative voltage and compresses in response to the second voltage $V_B$ being a positive voltage. It should be appreciated that it is also possible for the first electrode 62, the first piezo layer 68, and the third electrode 66 to form a polarized-inverted BAW resonator 76 and for the third electrode 66, the second piezo layer 70, and the second electrode 64 to form a polarized BAW resonator 78, without impacting functionalities of the acoustic resonator structure 56.

Figure 4:
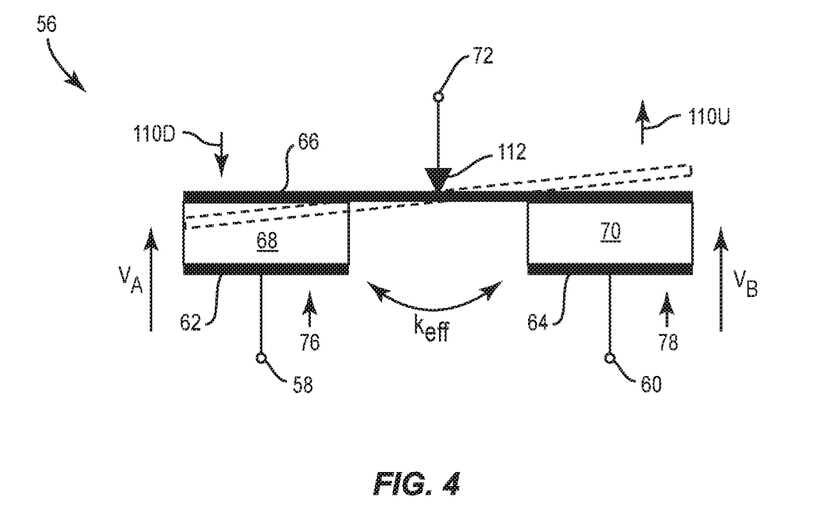
FIG. 4 is a schematic diagram providing an exemplary illustration of a mechanical coupling between a polarized acoustic resonator and a polarized-inverted acoustic resonator.

In a non-limiting example, the polarized BAW resonator can be mechanically coupled to the polarized-inverted BAW resonator based on the effective coupling factor ($k_{eff}$). In this regard, FIG. 4 is a schematic diagram providing an exemplary illustration of a mechanical coupling between the polarized BAW resonator 76 and the polarized-inverted BAW resonator 78 of FIG. 2A. Common elements between FIGS. 2A and 4 are shown therein with common element numbers and will not be re-described herein.

When the first voltage $V_A$ and the second voltage $V_B$ are both negative voltages, the first piezo layer 68 compresses in a downward direction 110D, while the second piezo layer 70 expands in an upward direction 110U. In contrast, when the first voltage $V_A$ and the second voltage $V_B$ are both positive voltages, the first piezo layer 68 expands in the upward direction 110U and the second piezo layer 70 compresses in the downward direction 110D. As such, the third electrode 66 can be seen as seesawing around a pivot point 112.

The tunable reactive circuit 80 in FIG. 2A can be provided according to a number of embodiments, which are discussed next with reference to FIGS. 5A-5D. Common elements between FIGS. 2A and 5A-5D are shown therein with common element numbers and will not be re-described herein.

Figure 5A:
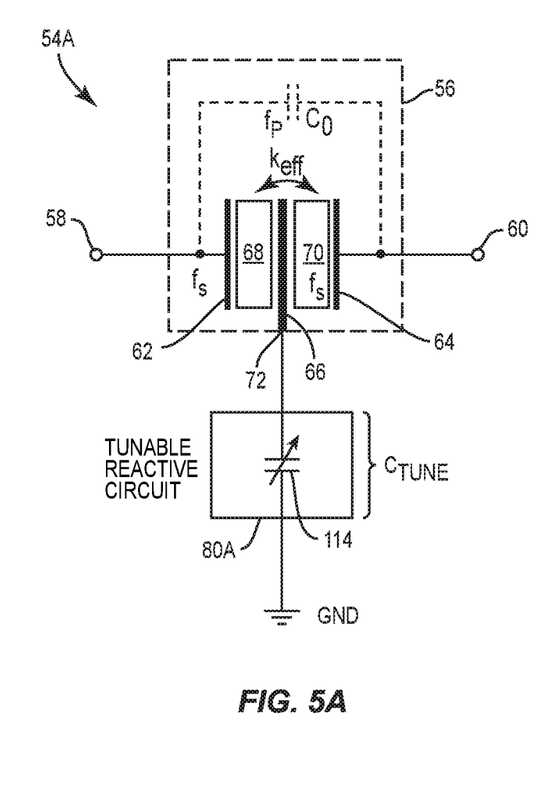
FIG. 5A is a schematic diagram of an exemplary acoustic structure configured according to an embodiment of the present disclosure.

FIG. 5A is a schematic diagram of an exemplary acoustic structure 54A configured according to an embodiment of the present disclosure. The acoustic structure 54A includes a tunable reactive circuit 80A. The tunable reactive circuit 80A includes a tunable capacitor 114 configured to provide the tunable capacitance ($C_{Tune}$).

Figure 5B:
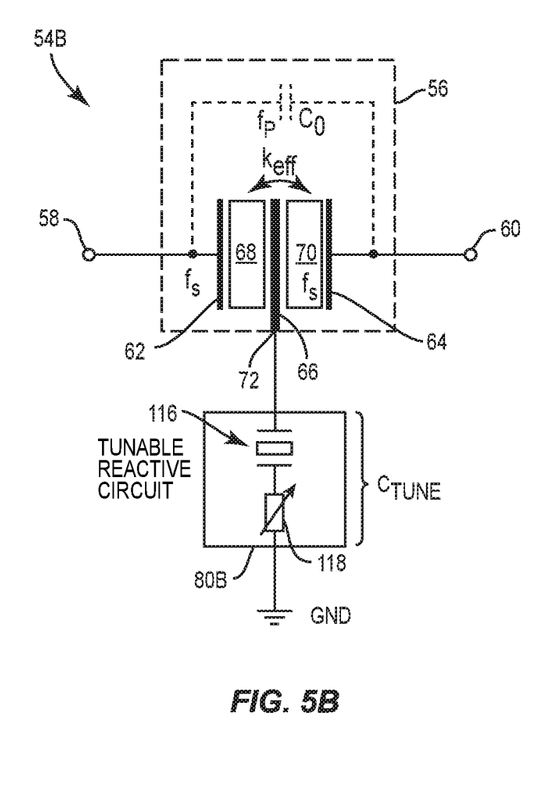
FIG. 5B is a schematic diagram of an exemplary acoustic structure configured according to another embodiment of the present disclosure.

FIG. 5B is a schematic diagram of an exemplary acoustic structure 54B configured according to an embodiment of the present disclosure. The acoustic structure 54B includes a tunable reactive circuit 80B. The tunable reactive circuit 80B includes an acoustic resonator 116 coupled in series to a tunable reactive element 118. The acoustic resonator 116 may be configured to resonate in the parallel resonance frequency ($f_P$) to provide the tunable capacitance ($C_{Tune}$).

Figure 5C:
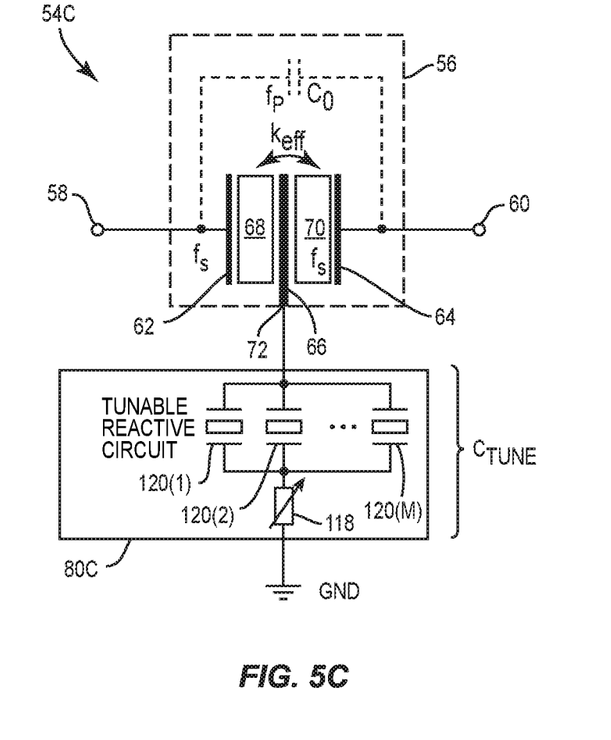
FIG. 5C is a schematic diagram of an exemplary acoustic structure configured according to another embodiment of the present disclosure.

FIG. 5C is a schematic diagram of an exemplary acoustic structure 54C configured according to an embodiment of the present disclosure. The acoustic structure 54C includes a tunable reactive circuit 80C. The tunable reactive circuit 80C includes a number of acoustic resonators 120(1)-120(M) coupled in parallel between the common node 72 and the tunable reactive element 118. The acoustic resonators 120(1)-120(M) may be configured to resonate in a number of parallel resonance frequencies to generate a number of tunable capacitances ($C_{Tune}$).

Figure 5D:
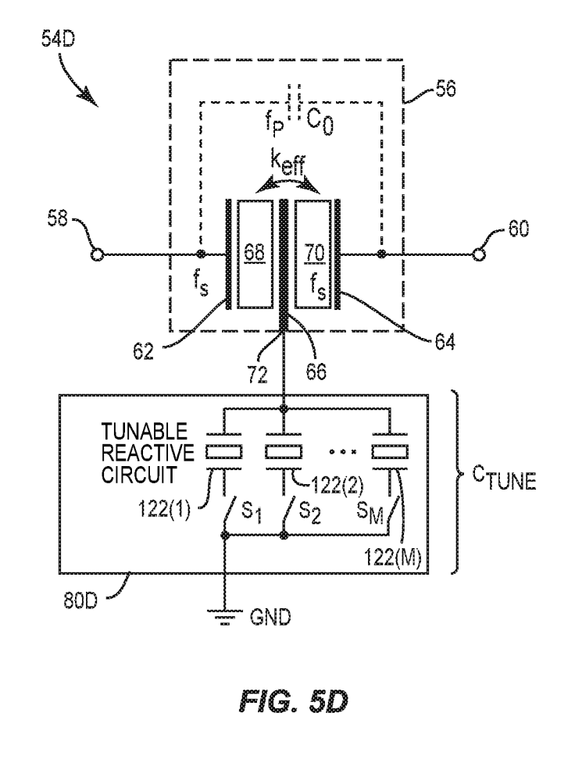
FIG. 5D is a schematic diagram of an exemplary acoustic structure configured according to another embodiment of the present disclosure.

FIG. 5D is a schematic diagram of an exemplary acoustic structure 54D configured according to an embodiment of the present disclosure. The acoustic structure 54D includes a tunable reactive circuit 80D. The tunable reactive circuit 80D includes a number of acoustic resonators 122(1)-122(M) coupled in parallel to a number of switches $S_1$-$S_M$, respectively. The acoustic resonators 122(1)-122(M) may be configured to resonate in a number of parallel resonance frequencies to generate a number of tunable capacitances ($C_{Tune}$).

Figure 6:
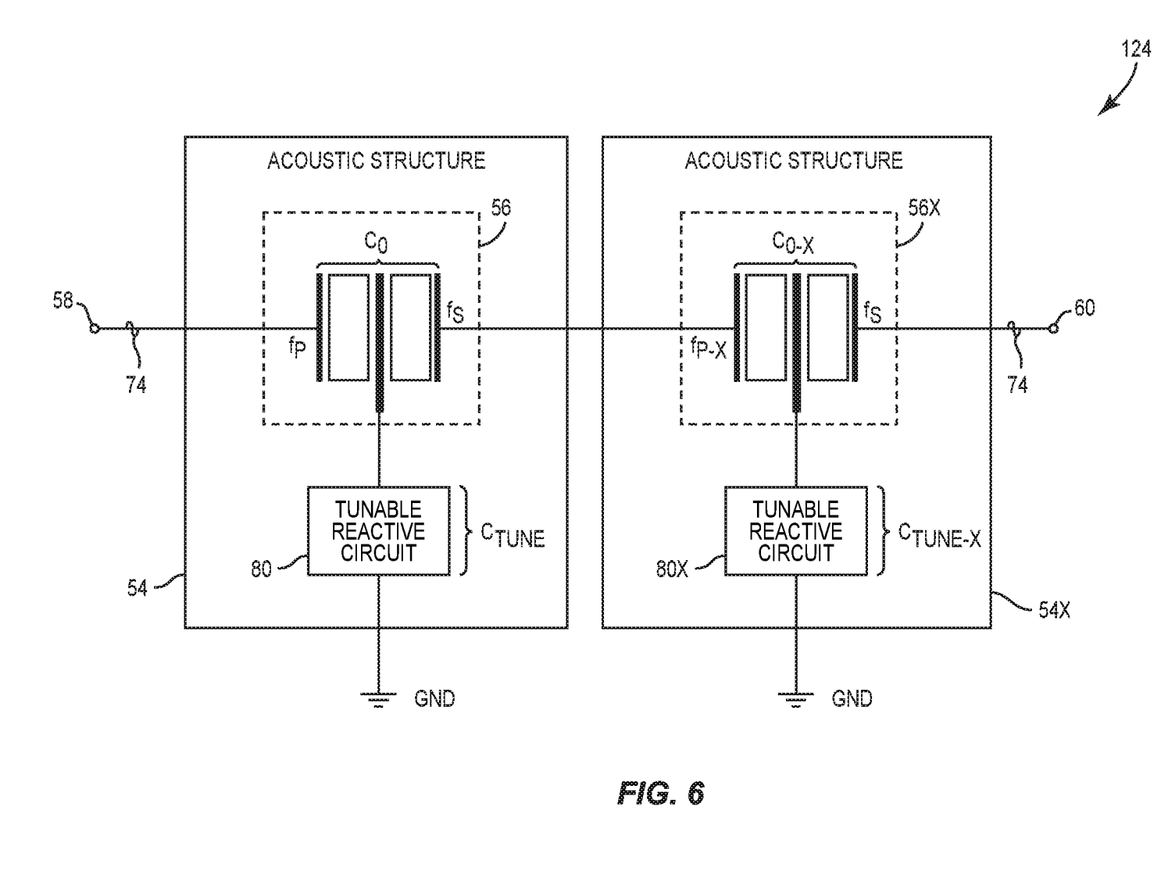
FIG. 6 is a schematic diagram of an exemplary acoustic apparatus incorporating at least two of the acoustic structure of FIG. 2A.

The acoustic structure 54 of FIG. 2A, the acoustic structure 54A of FIG. 5A, the acoustic structure 54B of FIG. 5B, the acoustic structure 54C of FIG. 5C, and/or the acoustic structure 54D of FIG. 5D can be provided in an acoustic apparatus (e.g., an acoustic ladder filter). In this regard, FIG. 6 is a schematic diagram of an exemplary acoustic apparatus 124 incorporating at least two of the acoustic structure 54 of FIG. 2A. Common elements between FIGS. 2A and 6 are shown therein with common element numbers and will not be re-described herein.

The acoustic apparatus 124 includes at least one second acoustic structure 54X coupled in series with the acoustic structure 54 between the input node 58 and the output node 60. The second acoustic structure 54X includes at least one second acoustic resonator structure 56X and at least one second tunable reactive circuit 80X. In a non-limiting example, the second acoustic resonator structure 56X and the second tunable reactive circuit 80X are identical to the acoustic resonator structure 56 and the tunable reactive circuit 80, respectively.

In this regard, the second acoustic resonator structure 56X is configured to receive the signal 74 from the acoustic resonator structure 56. Like the acoustic resonator structure 56, the second acoustic resonator structure 56X resonates in the series resonance frequency ($f_S$) to pass the signal 74 to the output node 60. The second acoustic resonator structure 56X also causes at least one second series capacitance ($C_{0-X}$) in at least one second parallel resonance frequency ($f_{P-X}$) to block the signal from the output node 60.

The second tunable reactive circuit 80X is configured to generate at least one second tunable capacitance ($C_{Tune-X}$) that is proportionally related to the second series capacitance ($C_{0-X}$). According to previous discussions in FIG. 2A, the second parallel resonance frequency ($f_{P-X}$) becomes higher than the series resonance frequency ($f_S$) when the second tunable capacitance ($C_{Tune-X}$) is lesser than two times the second series capacitance ($C_{0-X}$) ($C_{Tune-X} \leq 2C_{0-X}$), or lower than the series resonance frequency ($f_S$) when the second tunable capacitance ($C_{Tune-X}$) is greater than two times the second series capacitance ($C_{0-X}$) ($C_{Tune-X} > 2C_{0-X}$).

Figure 7:
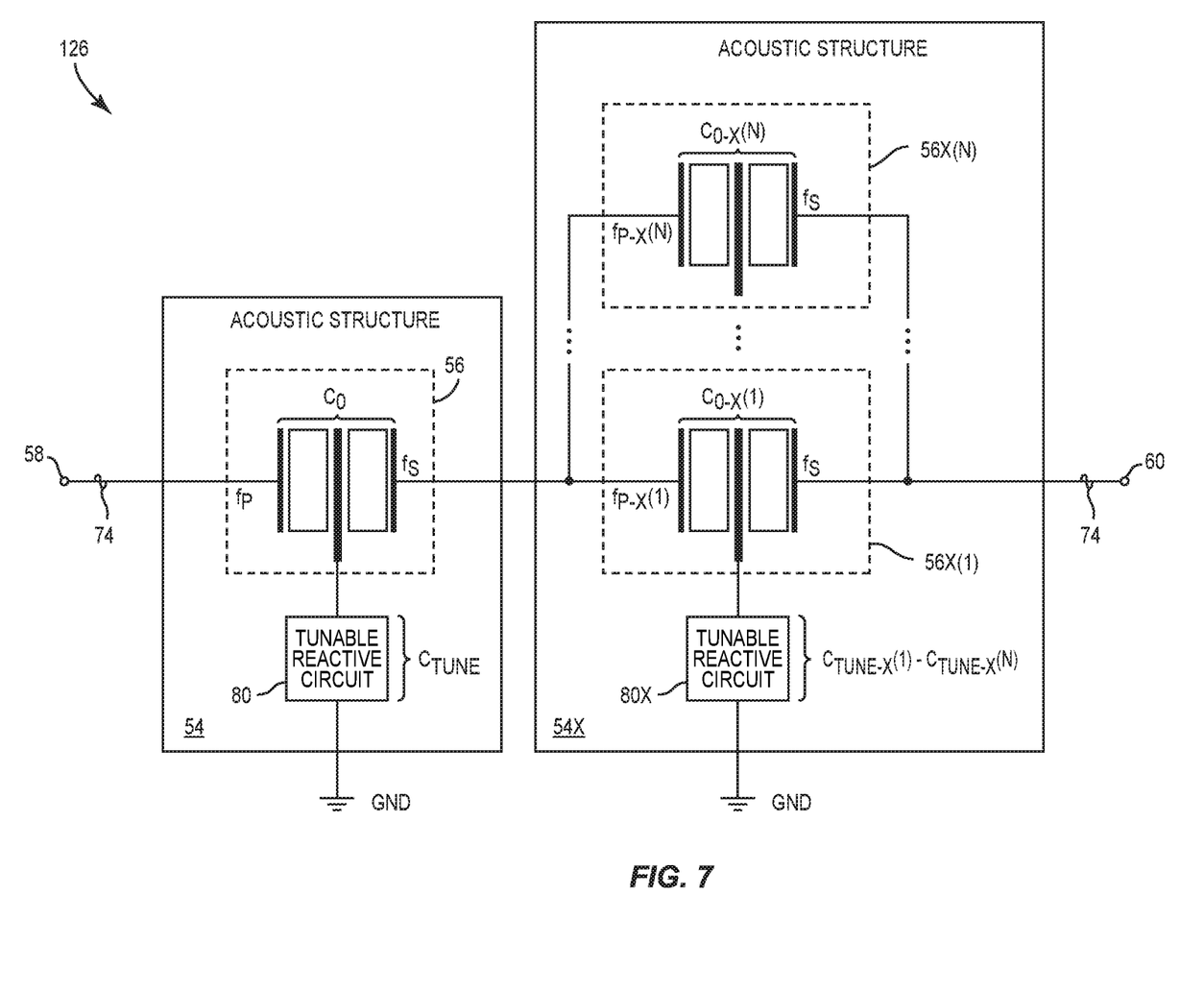
FIG. 7 is a schematic diagram of an exemplary acoustic apparatus incorporating the acoustic structure of FIG. 2A and at least one second acoustic structure.

FIG. 7 is a schematic diagram of an exemplary acoustic apparatus 126 incorporating the acoustic structure 54 of FIG. 2A and at least one second acoustic structure 54X. Common elements between FIGS. 2A and 7 are shown therein with common element numbers and will not be re-described herein.

The second acoustic structure 54X is coupled in series with the acoustic structure 54 between the input node 58 and the output node 60. The second acoustic structure 54X includes a number of second acoustic resonator structures 56X(1)-56X(N) and at least one second tunable reactive circuit 80X. In a non-limiting example, each of the second acoustic resonator structures 56X(1)-56(N) is identical to the acoustic resonator structure 56 and the second tunable reactive circuit 80X is identical to the tunable reactive circuit 80.

In this regard, each of the second acoustic resonator structures 56X(1)-56X(N) is configured to receive the signal 74 from the acoustic resonator structure 56. Like the acoustic resonator structure 56, each of the second acoustic resonator structures 56X(1)-56X(N) resonates in the series resonance frequency ($f_S$) to pass the signal 74 to the output node 60. The second acoustic resonator structures 56X(1)-56X(N) also cause a number of second series capacitances ($C_{0-X}(1)$-$C_{0-X}(N)$) in a number of second parallel resonance frequencies ($f_{P-X}(1)$-$f_{P-X}(N)$) to block the signal from the output node 60.

The second tunable reactive circuit 80X is configured to generate a number of second tunable capacitance ($C_{Tune-X}(1)$-$C_{Tune-X}(N)$) that are each proportionally related to the second series capacitance ($C_{0-X}$). According to previous discussions in FIG. 2A, the second parallel resonance frequencies ($f_{P-X}(1)$-$f_{P-X}(N)$) becomes higher than the series resonance frequency ($f_S$) when the second tunable capacitances ($C_{Tune-X}(1)$-$C_{Tune-X}(N)$) are respectively lesser than two times of the second series capacitance ($C_{0-X}$) ($C_{Tune-X}(1)$-$C_{Tune-X}(N) \leq 2C_{0-X}$). In contrast, the second parallel resonance frequencies ($f_{P-X}(1)$-$f_{P-X}(N)$) become lower than the series resonance frequency ($f_S$) when the second tunable capacitances ($C_{Tune-X}(1)$-$C_{Tune-X}(N)$) are respectively greater than two times the second series capacitance ($C_{0-X}$) ($C_{Tune-X}(1)$-$C_{Tune-X}(N) > 2C_{0-X}$).

Figure 8:
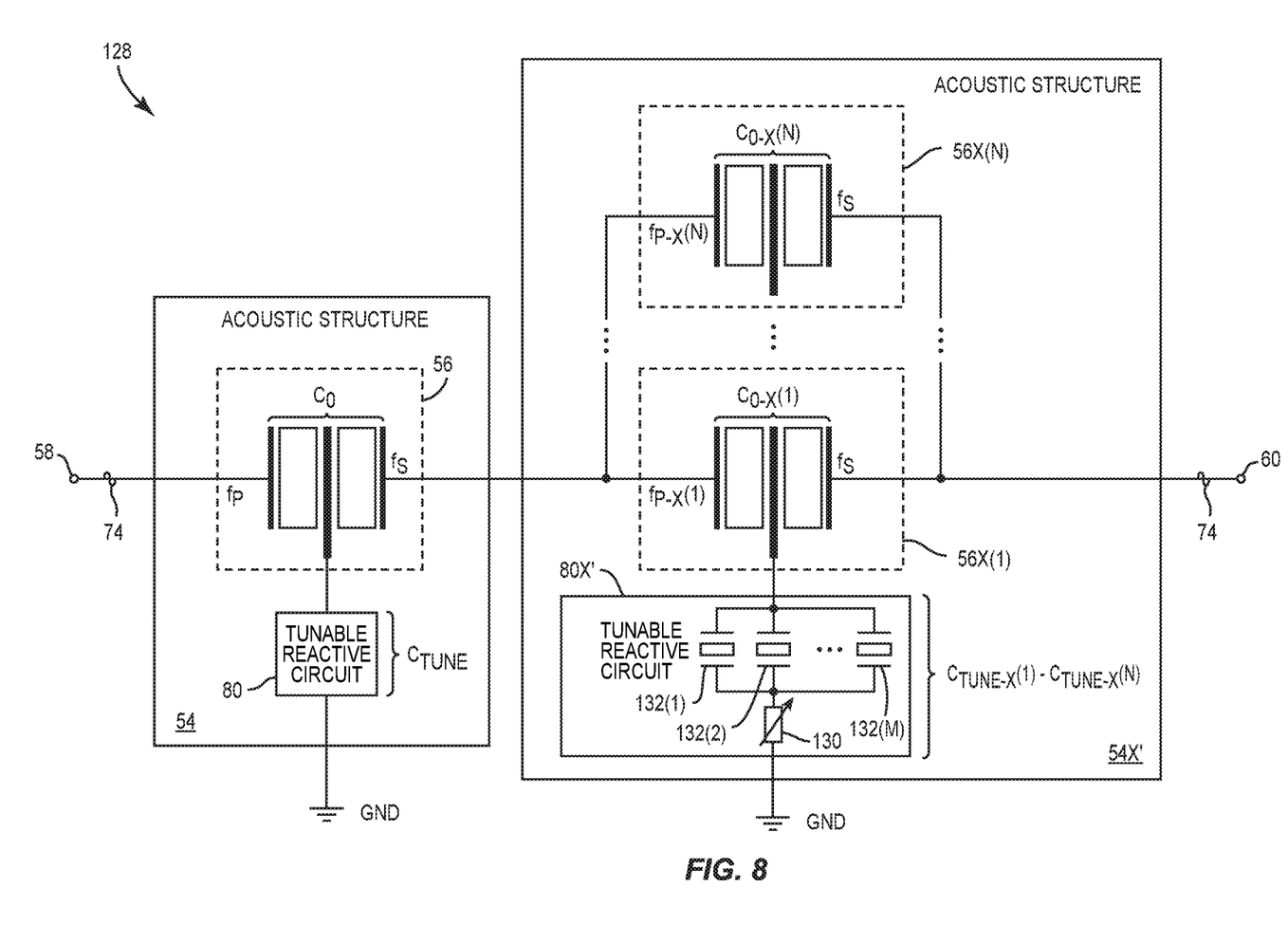
FIG. 8 is a schematic diagram of an exemplary acoustic apparatus incorporating the acoustic structure of FIG. 2A and at least one second acoustic structure.

FIG. 8 is a schematic diagram of an exemplary acoustic apparatus 128 incorporating the acoustic structure 54 of FIG. 2A and at least one second acoustic structure 54X'. Common elements between FIGS. 7 and 8 are shown therein with common element numbers and will not be re-described herein.

The second acoustic structure 54X' includes a second tunable reactive circuit 80X'. The second tunable reactive circuit 80X' includes a tunable reactive element 130 coupled to the ground (GND). The second tunable reactive circuit 80X' also includes a number of acoustic resonators 132(1)-132(N) coupled in parallel to the tunable reactive element 130. The acoustic resonators 132(1)-132(N) are configured to resonate in the second parallel resonance frequencies ($f_{P-X}(1)$-$f_{P-X}(N)$) to generate the second tunable capacitance ($C_{Tune-X}(1)$-$C_{Tune-X}(N)$) that are each proportionally related to the second series capacitance ($C_{0-X}$).

Those skilled in the art will recognize improvements and modifications to the embodiments of the present disclosure. All such improvements and modifications are considered within the scope of the concepts disclosed herein and the claims that follow.

What is claimed is:

1. An acoustic structure comprising:
   an input node and an output node;
   an acoustic resonator structure comprising a first acoustic resonator and a second acoustic resonator corresponding to an effective coupling factor, the acoustic resonator structure is coupled between the input node and the output node and configured to:
      resonate in a series resonance frequency to pass a signal from the input node to the output node; and
      cause at least one series capacitance between the input node and the output node to block the signal in at least one parallel resonance frequency; and
   a tunable reactive circuit coupled to the acoustic resonator structure and configured to:
      generate at least one tunable capacitance related to the at least one series capacitance to cause the at least one parallel resonance frequency to be changed relative to the series resonance frequency;
      cause the effective coupling factor to be a positive coupling factor when the at least one tunable capacitance is less than or equal to two times the at least one series capacitance; and
      cause the effective coupling factor to be a negative coupling factor when the at least one tunable capacitance is greater than two times the at least one series capacitance.

2. The acoustic structure of claim 1 wherein the tunable reactive circuit is further configured to generate the at least one tunable capacitance to be less than or equal to two times the at least one series capacitance to cause the at least one parallel resonance frequency to be higher than the series resonance frequency.

3. The acoustic structure of claim 1 wherein the tunable reactive circuit is further configured to generate the at least one tunable capacitance greater than two times the at least one series capacitance to cause the at least one parallel resonance frequency to be lower than the series resonance frequency.

4. The acoustic structure of claim 1 wherein the acoustic resonator structure further comprises:
 a first electrode coupled to the input node;
 a second electrode coupled to the output node;
 a third electrode provided between the first electrode and the second electrode;
 a first piezo layer provided between the first electrode and the third electrode; and
 a second piezo layer provided between the second electrode and the third electrode;
 wherein:
  the first electrode, the first piezo layer, and the third electrode are configured to collectively form the first acoustic resonator; and
  the third electrode, the second piezo layer, and the second electrode are configured to collectively form the second acoustic resonator.

5. The acoustic structure of claim 4 wherein the tunable reactive circuit is further configured to generate the at least one tunable capacitance lesser than or equal to two times the at least one series capacitance to cause the at least one parallel resonance frequency to be higher than the series resonance frequency.

6. The acoustic structure of claim 4 wherein the tunable reactive circuit is further configured to generate the at least one tunable capacitance greater than two times the at least one series capacitance to cause the at least one parallel resonance frequency to be lower than the series resonance frequency.

7. The acoustic structure of claim 4 wherein the tunable reactive circuit is coupled between the third electrode and a ground to generate the at least one tunable capacitance between the third electrode and the ground.

8. The acoustic structure of claim 7 wherein the tunable reactive circuit comprises a tunable capacitor configured to generate the at least one tunable capacitance between the third electrode and the ground.

9. The acoustic structure of claim 7 wherein the tunable reactive circuit comprises an acoustic resonator coupled in series to a tunable reactive element and configured to resonate in the at least one parallel resonance frequency to generate the at least one tunable capacitance between the third electrode and the ground.

10. The acoustic structure of claim 7 wherein the tunable reactive circuit comprises:
 a tunable reactive element coupled to the ground; and
 a plurality of tunable acoustic resonators coupled in parallel between the third electrode and the tunable reactive element and configured to resonate in a plurality of parallel resonance frequencies to generate a plurality of tunable capacitances, respectively.

11. The acoustic structure of claim 4 wherein the first acoustic resonator and the second acoustic resonator are mechanically coupled.

12. The acoustic structure of claim 4 wherein:
 the first piezo layer is selected to cause the first acoustic resonator to function as a polarized acoustic resonator; and
 the second piezo layer is selected to cause the second acoustic resonator to function as a polarized-inverted acoustic resonator.

13. An acoustic apparatus comprising:
 an input node and an output node;
 an acoustic resonator structure coupled between the input node and the output node and configured to:
  resonate in a series resonance frequency to pass a signal from the input node to the output node; and
  cause a series capacitance between the input node and the output node to block the signal in a parallel resonance frequency;
 a tunable reactive circuit coupled to the acoustic resonator structure and configured to generate a tunable capacitance proportionally related to the series capacitance to cause the parallel resonance frequency to be changed relative to the series resonance frequency;
 at least one second acoustic resonator structure coupled in series to the acoustic resonator structure and comprising a plurality of parallel acoustic resonator structures configured to cause a plurality of second series capacitances in a plurality of second parallel resonance frequencies to block the signal; and
 at least one second tunable reactive circuit coupled to the at least one second acoustic resonator structure and configured to generate a plurality of second tunable capacitances related to the plurality of second series capacitances to cause the plurality of second parallel resonance frequencies to be changed relative to the series resonance frequency.

14. The acoustic apparatus of claim 13 wherein the tunable reactive circuit is further configured to generate the tunable capacitance greater than two times the series capacitance to cause the parallel resonance frequency to be lower than the series resonance frequency.

15. The acoustic apparatus of claim 13 wherein the at least one second tunable reactive circuit comprises:
 a tunable reactive element coupled to a ground; and
 a plurality of acoustic resonators coupled in parallel between the at least one second acoustic resonator structure and the tunable reactive element, the plurality of acoustic resonators is configured to resonate in the plurality of second parallel resonance frequencies to generate the plurality of second tunable capacitances related to the plurality of second series capacitances, respectively, to cause the plurality of second parallel resonance frequencies to be changed relative to the series resonance frequency.

16. The acoustic apparatus of claim 13 wherein the tunable reactive circuit is further configured to generate the tunable capacitance lesser than or equal to two times the series capacitance to cause the parallel resonance frequency to be higher than the series resonance frequency.

* * * * *